US012289999B2

(12) United States Patent
Bircumshaw et al.

(10) Patent No.: US 12,289,999 B2
(45) Date of Patent: Apr. 29, 2025

(54) HIGH DENSITY MULTI-POLED THIN FILM PIEZOELECTRIC DEVICES AND METHODS OF MAKING THE SAME

(71) Applicant: Exo Imaging, Inc., Redwood City, CA (US)

(72) Inventors: Brian Bircumshaw, Oakland, CA (US); Sandeep Akkaraju, Wellesley, MA (US)

(73) Assignee: Exo Imaging, Inc., Santa Clara, CA (US)

( * ) Notice: Subject to any disclaimer, the term of this patent is extended or adjusted under 35 U.S.C. 154(b) by 759 days.

(21) Appl. No.: 17/390,374

(22) Filed: Jul. 30, 2021

(65) Prior Publication Data
US 2021/0359192 A1    Nov. 18, 2021

Related U.S. Application Data

(63) Continuation of application No. PCT/US2020/020163, filed on Feb. 27, 2020.
(Continued)

(51) Int. Cl.
*H01L 41/047*    (2006.01)
*H01L 41/314*    (2013.01)
(Continued)

(52) U.S. Cl.
CPC ......... *H10N 30/874* (2023.02); *H10N 30/074* (2023.02); *H10N 30/082* (2023.02); *H10N 30/877* (2023.02)

(58) Field of Classification Search
CPC .. H10N 30/074; H10N 30/082; H10N 30/874; H10N 30/877
(Continued)

(56) References Cited

U.S. PATENT DOCUMENTS 10,079,218 B1    9/2018  Lin et al.
2007/0222339 A1*  9/2007  Lukacs ............... B06B 1/0622
                                                    310/334
(Continued)

FOREIGN PATENT DOCUMENTS

CN    105575766 A    5/2016
CN    105897211 A    8/2016
(Continued)

OTHER PUBLICATIONS

Kusano yet al: "Effects of DC Bias Tuning on Air-Coupled PZT Piezoelectric Micromachined Ultrasonic Transducers", Journal of Microelectromechanical Systems., vol. 27, No. 2, Feb. 12, 2018, pp. 296-304, XP055646136.
(Continued)

*Primary Examiner* — Emily P Pham
*Assistant Examiner* — Monica Mata
(74) *Attorney, Agent, or Firm* — Morgan, Lewis & Bockius LLP

(57) ABSTRACT

Disclosed are multi-poled piezoelectric devices with improved packing density and methods for making such multi-poled piezoelectric devices with improved packing density. The multi-poled piezoelectric devices comprise: a) a top electrode, a piezoelectric layer, and a bottom electrode fabricated on a substrate; b) vias generated by etching the piezoelectric layer, the top electrode, or both; and c) a re-distribution layer (RDL) deposited over one or more of: the top electrode, the piezoelectric layer, the bottom electrode, or the one or more vias.

19 Claims, 15 Drawing Sheets

Related U.S. Application Data

(60) Provisional application No. 62/811,960, filed on Feb. 28, 2019.

(51) Int. Cl.
*H01L 41/332* (2013.01)
*H10N 30/074* (2023.01)
*H10N 30/082* (2023.01)
*H10N 30/87* (2023.01)

(58) Field of Classification Search
USPC ........................................................ 310/365
See application file for complete search history.

(56) References Cited

U.S. PATENT DOCUMENTS

| | | | |
|---|---|---|---|
| 2011/0120971 A1 | 5/2011 | Martin et al. | |
| 2014/0152152 A1 | 6/2014 | Burak et al. | |
| 2014/0240405 A1* | 8/2014 | Furuya | H10N 30/80 |
| | | | 310/365 |
| 2017/0252777 A1 | 9/2017 | Kidwell, Jr. et al. | |
| 2018/0153512 A1 | 6/2018 | Akkaraju et al. | |
| 2019/0035757 A1 | 1/2019 | Yu et al. | |

FOREIGN PATENT DOCUMENTS

| | | |
|---|---|---|
| JP | H09246246 A | 9/1997 |
| JP | 2003347402 A | 12/2003 |
| JP | 2009231484 A | 10/2009 |
| JP | 2015087284 A | 5/2015 |
| JP | 2018056335 A | 4/2018 |
| WO | WO-2020176766 A1 | 9/2020 |

OTHER PUBLICATIONS

Extended European Search Report of Application No. EP20763487, dated Jul. 13, 2023, 9 pages.

PCT/US2020/020163 International Search Report and Written Opinion dated Jun. 25, 2020.

PCT/US2020/020163 Invitation to Pay Additional Fees dated Apr. 30, 2020.

* cited by examiner

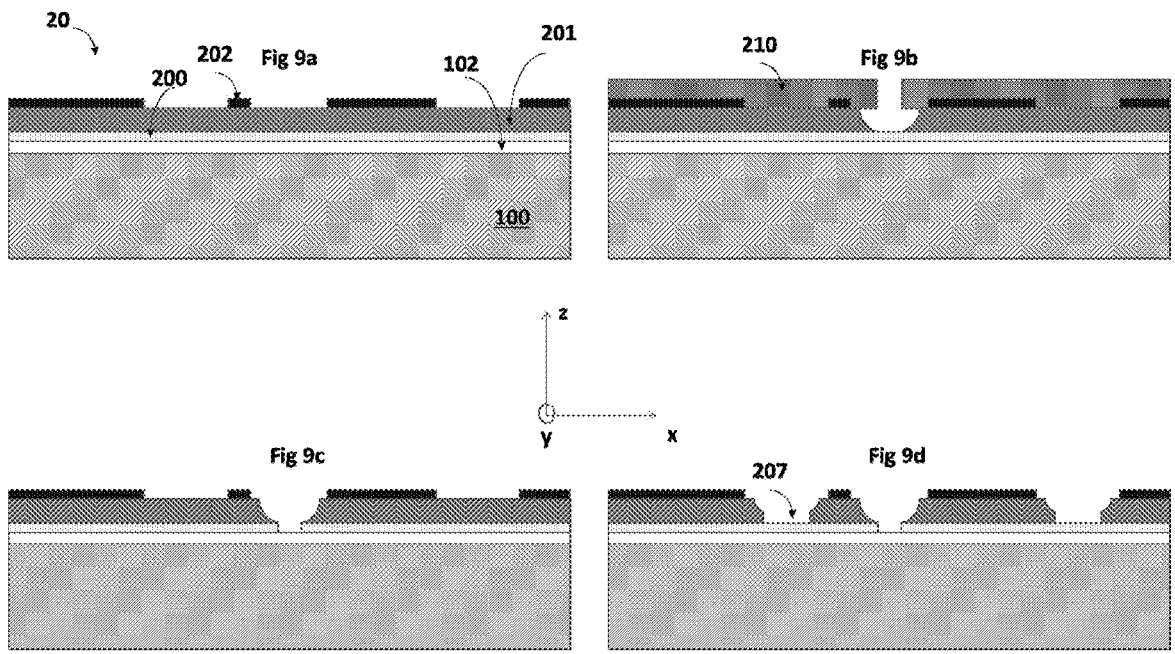

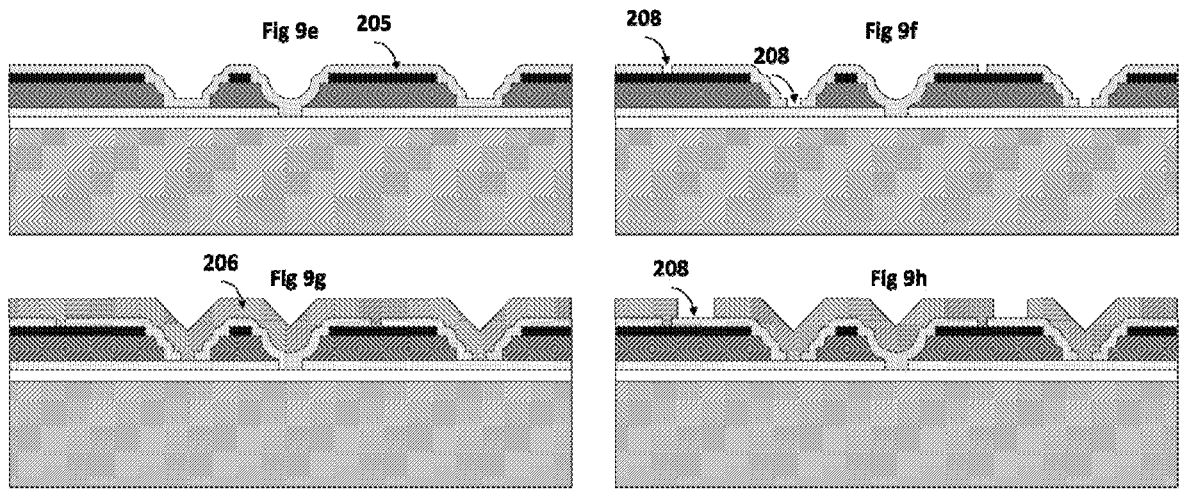

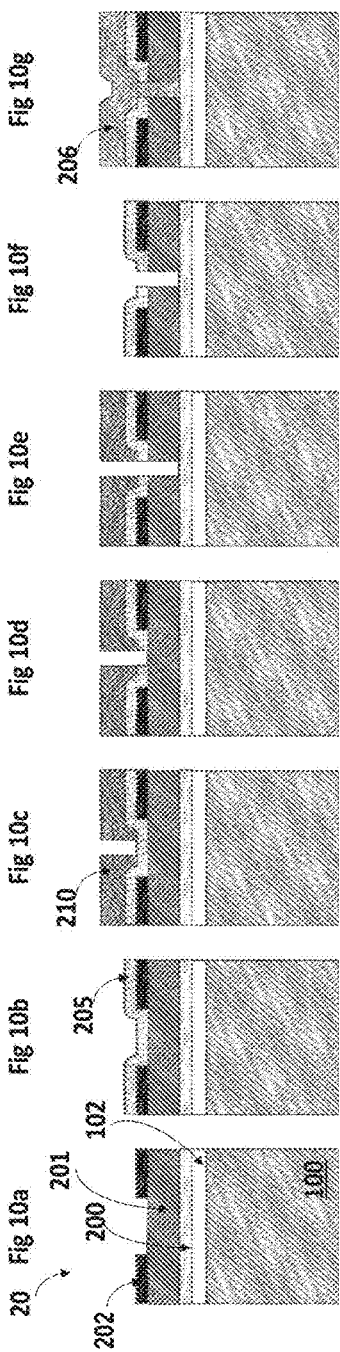

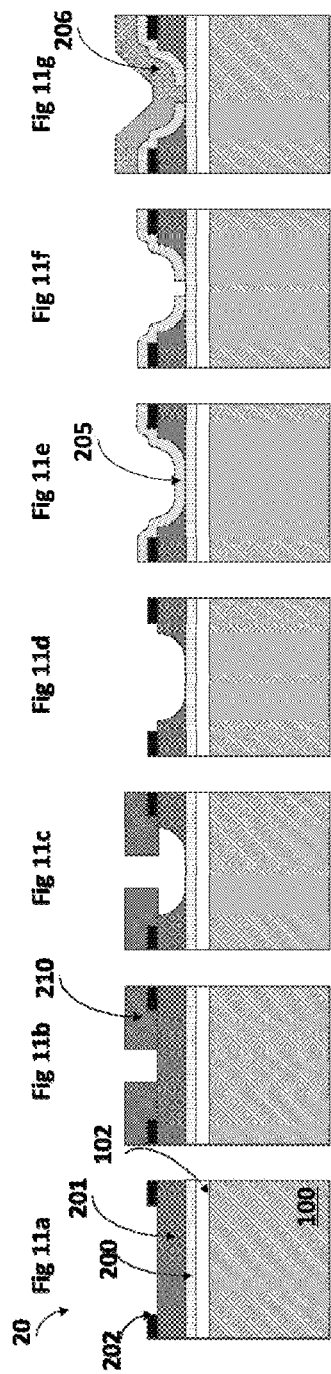

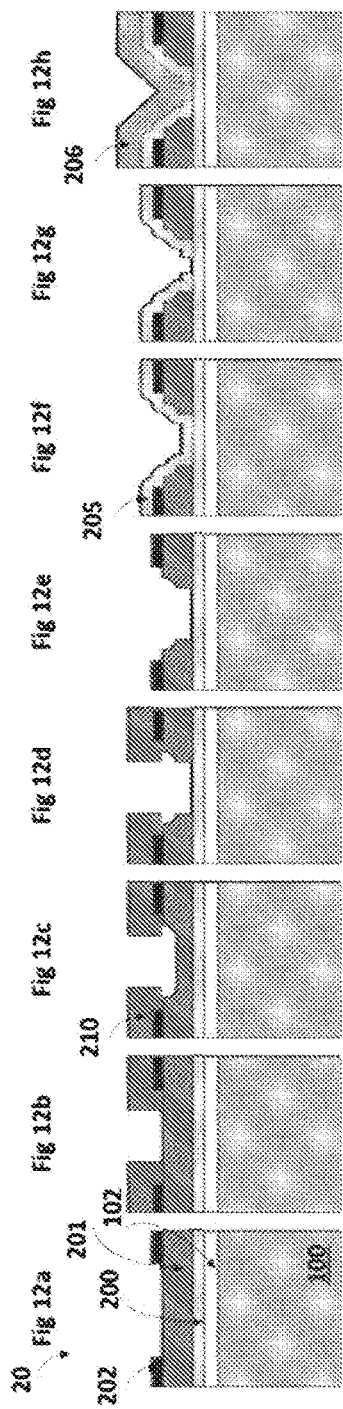

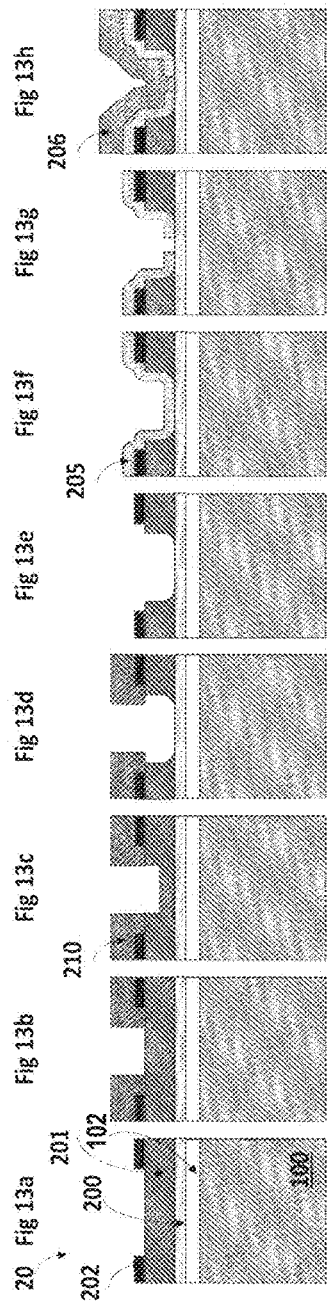

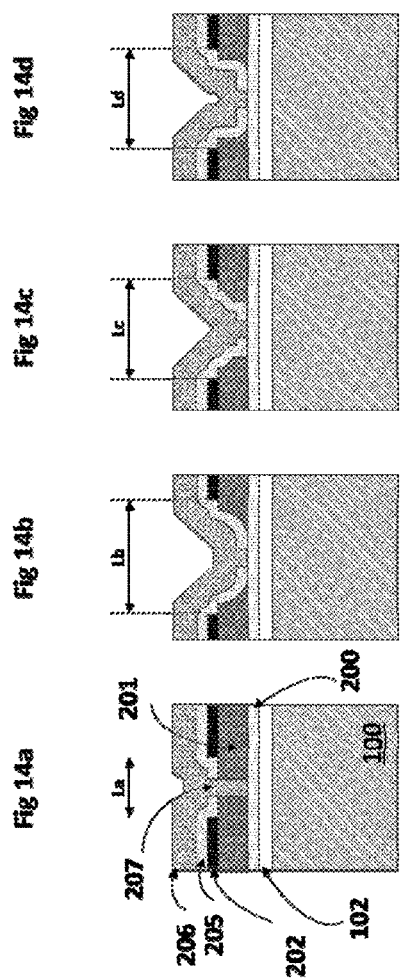

HIGH DENSITY MULTI-POLED THIN FILM PIEZOELECTRIC DEVICES AND METHODS OF MAKING THE SAME

CROSS-REFERENCE

This application is a continuation of International Patent Application PCT/US2020/020163, filed Feb. 27, 2020, entitled "High Density Multi-Poled Thin Film Piezoelectric Devices and Methods of Making the Same"; which claims the benefit of U.S. Provisional Application No. 62/811,960, filed Feb. 28, 2019, entitled "High Density Multi-Poled Thin Film Piezoelectric Devices and Methods of Making the Same"; which is incorporated herein by reference for all purposes in its entirety.

BACKGROUND

A piezoelectric device utilizes a piezoelectric material in its operation. A thin film piezoelectric device includes a piezoelectric material that is a thin film as opposed to a bulk material. The thin film piezoelectric devices can include capacitors, memory cells, ink jet printheads, piezoelectric micromachined ultrasonic transducers (pMUTs), and gyros.

SUMMARY

A thin film can have lateral dimensions are substantially larger than its thickness or depth along a vertical direction (e.g., 10× or 100× larger). Thin film in piezoelectric devices can be on the order of 10 µm thick or less. The exemplary thin film piezoelectric devices can include capacitors, memory cells, ink jet printheads, pMUTs, and gyros. Other applications can abound in the sensor and actuator areas, such as micro mirror actuators, speakerphones, microphones, auto-focus drivers, passive infrared detectors, and so on.

Piezoelectric materials can become ferroelectric when below its Curie temperature, Tc. When ferroelectric, the unit cell of the piezoelectric material can have asymmetry in its unit cell such that the charged constituent ions form a dipole (e.g., the center of positive charge is displaced from the center of negative charge). The dipoles can form domains in which all the dipoles are pointed in the same direction. In some embodiments, the piezoelectric material has multiple domains, with each domain's dipole moment at 180 degrees or 90 degrees to the adjacent domain(s). Domains separated by a crystal boundary of the piezoelectric material can take on any relative orientation. In some embodiments, the process of poling aligns the domains within a piezoelectric material, and the dipoles of different piezoelectric materials, substantially in one direction.

In some cases, thin film piezoelectric devices are capable of better performance if they are of multiple pole directions (e.g., two directions). Using a bipolar film, for example, increases the charge for a deflection of the membrane while reducing a number of electrode connections required by the transducer. Generating more charge increases the performance of the transducer. Actuators and sensors utilizing bending beams/diaphragms are amongst the examples of such devices, and include pMUTs, ink jet printheads, gyros, speakerphones, microphones, mirror actuators, and auto-focus drivers. For example, for pMUTs with bipolar film(s), drive and/or sense scheme can be simpler or easier to implement than devices with unipolar thin film(s). Additionally, a simpler scheme (e.g., for the bias voltage) is needed to keep a bipolar film poled than a unipolar film. In some embodiments, to keep the piezoelectric films poled during operation, typically a constant bias voltage, Vb, is maintained across the film that aligns with the polarization direction. Poling the films during operation helps to keep the dipole moments of the piezoelectric film aligned in one direction, enabling good operation of the device. Time dependent operating voltages, Vd(t), can be used such that Vb+Vd(t) is always aligned with the polarization direction. In some embodiments, this ensures that the piezoelectric film remain poled.

In some embodiments, the disclosures herein include independent multi-poled piezoelectric devices that can be generated using an identical top electrode, piezoelectric layer, bottom electrode all fabricated on a substrate. In some embodiments, the methods and devices herein advantageously include vertical interconnect accesses (vias) with improved topography over existing vias. In some embodiments, the methods and devices herein advantageously include vias that allow higher packing density of piezoelectric devices than existing vias. In some embodiments, the methods and devices herein advantageously include vias with a stepped profile at the piezoelectric layer. In some embodiments, the methods herein advantageous combine two different etching methods to etch the piezoelectric layer thereby generating an improved profile of the vias. In some embodiments, the high packing density multi-poled piezoelectric devices are used in pMUTs for ultrasonic imaging. In some embodiments, the pMUTs comprising the high packing density multi-poled piezoelectric devices herein can be generated using an identical top electrode, piezoelectric layer, bottom electrode all fabricated on a substrate. In some embodiments, the pMUTs comprising the high packing density multi-poled piezoelectric devices herein includes vias with improved topography over existing vias.

In one aspect, disclosed herein is a method for producing multi-poled piezoelectric devices from a first piezoelectric device, the method comprising: a) providing a first piezoelectric device, the first piezoelectric device comprising: a first bottom electrode, a first piezoelectric layer, a first top electrode, and a first substrate; b) separating the first piezoelectric device into a plurality of piezoelectric devices by etching one or more of the first bottom electrode, the first piezoelectric layer, or the first top electrode, wherein each of the plurality of piezoelectric devices comprises a bottom electrode, a piezoelectric layer, and a top electrode; c) generating one or more vertical interconnect access (vias) by etching the first piezoelectric layer, the first top electrode, or both; and d) depositing a re-distribution layer (RDL) over the first piezoelectric device, the one or more vias, or both.

In some embodiments, step b) comprises: i) etching the first top electrode to generate a plurality of top electrodes; ii) subsequent to i), etching the first piezoelectric layer to generate a plurality of piezoelectric layers; and iii) subsequent to ii), etching the first bottom electrode to generate a plurality of bottom electrodes of the plurality of piezoelectric devices. In some embodiments, steps i), ii) or iii) comprises using one or more of: dry etch, anisotropic etch, wet etch, or isotropic etch.

In some embodiments, step b) further comprises patterning using a photoresist in one or more of i), ii), or iii) for etching. In some embodiments, step b) further comprises patterning for etching using a photoresist in ii). In some embodiments, step iii) is without removal of the photoresist in ii).

In some embodiments, the method further comprises subsequent to step b) and prior to step c), removing the photoresist.

In some embodiments, step d) comprises using one or more of: chemical vapor deposition (CVD), plasma enhanced chemical vapor deposition (PECVD), sputter deposition, evaporation, spin-on, or plating materials. In some embodiments, step c) comprises: i) depositing a RDL dielectric layer over the first piezoelectric device; and ii) depositing a RDL conductor layer over the RDL dielectric layer. In some embodiments, step d) further comprises: subsequent to step i) and prior to step ii), etching and patterning the RDL dielectric layer; subsequent to step ii), etching and patterning the RDL conductor layer, or both. Another embodiment of step d) comprises: subsequent to step i) and prior to step ii), etching and patterning the RDL dielectric layer; step ii) is achieved using a lift-off process to both deposit and pattern the RDL conductor layer. A further embodiment of step d) includes a process by which both steps i) and ii) are performed via lift-off.

Yet another embodiment of step d) is such that subsequent to the step of i) depositing and patterning the RDL dielectric layer via lift-off; prior to step ii), patterning and etching the RDL conducting layer.

In some embodiments, step c) comprises using an isotropic etch or a wet etch to etch through the first piezoelectric layer. In some embodiments, step c) comprises using an anisotropic etch or a dry etch to etch through the first piezoelectric layer. In some embodiments, step c) comprises: i) deposit a photoresist over the first piezoelectric device; ii) etching the first piezoelectric layer to a pre-determined depth; and iii) etching through the first piezoelectric layer from the pre-determined depth to stop at a top surface of the first bottom electrode along a vertical direction and; iv) removing the photoresist from the first piezoelectric device. In some embodiments, step ii) comprises using an isotropic etch or a wet etch and step iii) comprises using an anisotropic etch or a dry etch. In some embodiments, step ii) comprises using an anisotropic etch or a dry etch and step iii) comprises using an isotropic etch or a wet etch. In some embodiments, the first piezoelectric layer comprises a stepped profile along a vertical direction configured to mitigate issues in topography of the vias. In some embodiments, the pre-determined depth is less than a full depth of the piezoelectric layer along a vertical direction. In some embodiments, the method herein is configured for decreasing a characteristic length of the one or more vias along a horizontal direction thereby increasing packing density of the plurality of piezoelectric devices.

In some embodiments, step c) comprises: i) deposit a photoresist over the first piezoelectric device; ii) etching the first piezoelectric layer using isotropic etch; and iii) removing the photoresist. In some embodiments, etching one or more of the first bottom electrode, the first piezoelectric layer, or the first top electrode comprises etching two of the first bottom electrode, the first piezoelectric layer, and the first top electrode. In some embodiments, each of the plurality of piezoelectric devices is independent. In some embodiments, the multi-poled piezoelectric device or the first piezoelectric device is at least part of a piezoelectric micromachined ultrasonic transducer (pMUT).

In another aspect, disclosed herein is a method for producing multi-poled piezoelectric devices, the method comprising: a) providing a first piezoelectric device, the first piezoelectric device comprising: a first bottom electrode, a first piezoelectric layer, a first top electrode, and a first substrate; b) etching the first top electrode; c) depositing a RDL dielectric layer over the first top electrode; d) etching the RDL dielectric layer using anisotropic etch; e) etching the first piezoelectric layer using anisotropic etch; and f) depositing a RDL conductor layer over the RDL dielectric layer. In some embodiments, the method further comprises depositing a photoresist subsequent to step c) and prior to step d); and removing the photo resist prior to step f). In some embodiments, the multi-poled piezoelectric device or the first piezoelectric device is at least part of a pMUT.

In yet another aspect, disclosed herein is a multi-poled piezoelectric device, the device comprising: a) a top electrode, a piezoelectric layer, and a bottom electrode fabricated on a substrate; b) one or more vias generated by etching the piezoelectric layer, the top electrode, or both; and c) a re-distribution layer (RDL) deposited over one or more of: the top electrode, the piezoelectric layer, the bottom electrode, or the one or more vias. In some embodiments, the one or more vias comprises: a pre-determined depth in the piezoelectric layer etched by a first method; a second depth continuing from the pre-determined depth in the piezoelectric layer etched by a second method to stop on a top surface of the bottom electrode. In some embodiments, the first method is an isotropic etch or a wet etch and the second method is an anisotropic etch or a dry etch. In some embodiments, the first method is an anisotropic etch or a dry etch and the second method is an isotropic etch or a wet etch. In some embodiments, the first piezoelectric layer comprises a stepped profile along a vertical direction configured to mitigate issues in topography of the vias. In some embodiments, the pre-determined depth is less than a full depth of the piezoelectric layer along a vertical direction. In some embodiments, the RDL comprises a RDL dielectric layer and a RDL conductor layer thereabove. In some embodiments, one or both of the RDL dielectric layer and the RDL conductor layer is etched. In some embodiments, the RDL dielectric layer is patterned and etched using a lift-off process and the RDL conductor layer is also deposited and patterned using a lift-off process. In some embodiments, one or more of the top electrode, piezoelectric layer, or bottom electrode is generated from etching a first piezoelectric device. In some embodiments, the first piezoelectric device comprises a first bottom electrode, a first piezoelectric layer, a first top electrode, and a first substrate. In some embodiments, the first piezoelectric device is uni-poled. In some embodiments, the first piezoelectric device is multi-poled. In some embodiments, the multi-poled piezoelectric device or the first piezoelectric device is at least part of a pMUT.

BRIEF DESCRIPTION OF THE DRAWINGS

A better understanding of the features and advantages of the present subject matter will be obtained by reference to the following detailed description that sets forth illustrative embodiments and the accompanying drawings of which:

FIG. 4 shows an exemplary drive scheme for the unipolar pMUT in FIGS. 3a-3b to efficiently drive the drum mode in FIG. 2a;

FIG. 6 shows a graph of an exemplary drive scheme for the dipolar pMUT in FIGS. 5a-5b to efficiently drive the drum mode of FIG. 2a;

FIG. 8 shows a graph of an exemplary drive scheme for the dipolar pMUT in FIGS. 7a-7b to efficiently drive the drum mode of FIG. 2a;

FIGS. 9a-9h show section views of an exemplary process sequence for producing high density multi-poled piezoelectric devices with a Re-Distribution Layer (RDL);

FIGS. 10a-10g show section views of an exemplary process sequence for producing high packing density via(s) using anisotropic etching;

FIGS. 11a-11g show section views of an exemplary process sequence for producing high packing density via(s) using isotropic etching;

FIGS. 12a-12h show section views of an exemplary process sequence for producing high packing density via(s) using isotropic followed by anisotropic etching;

FIGS. 13a-13h show section views of an exemplary process sequence for producing high packing density via(s) using anisotropic followed by isotropic etching; and FIGS. 14a-14d show section views of a comparison of via dimensions of the various via formation methods disclosed herein.

DETAILED DESCRIPTION

Figure 1:
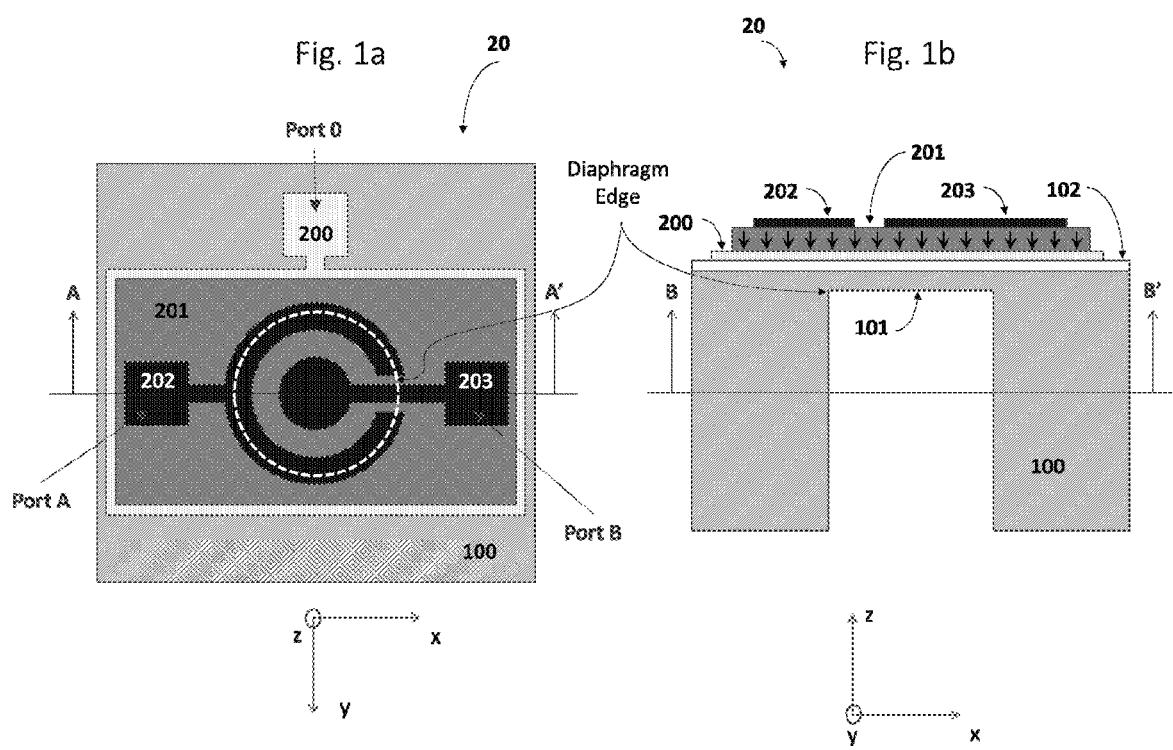
FIGS. 1a and 1b show an exemplary diaphragm-based pMUT in layout (FIG. 1a) and cross-section (FIG. 1b) views; the pole direction of the piezoelectric material is indicated by the arrows in the cross-section view.

In one aspect, disclosed herein is a method for producing multi-poled piezoelectric devices from a first piezoelectric device, the method comprising: a) providing a first piezoelectric device, the first piezoelectric device comprising: a first bottom electrode, a first piezoelectric layer, a first top electrode, and a first substrate; b) separating the first piezoelectric device into a plurality of piezoelectric devices by etching one or more of the first bottom electrode, the first piezoelectric layer, or the first top electrode, wherein each of the plurality of piezoelectric devices comprises a bottom electrode, a piezoelectric layer, and a top electrode; c) generating one or more vertical interconnect access (vias) by etching the first piezoelectric layer, the first top electrode, or both; and d) depositing a re-distribution layer (RDL) over the first piezoelectric device, the one or more vias, or both. In some embodiments, step b) comprises: i) etching the first top electrode to generate a plurality of top electrodes; ii) subsequent to step i), etching the first piezoelectric layer to generate a plurality of piezoelectric layers; and iii) subsequent to step ii), etching the first bottom electrode to generate a plurality of bottom electrodes of the plurality of piezoelectric devices. In some embodiments, steps i), ii) or iii) comprises using one or more of: dry etch, anisotropic etch, wet etch, or isotropic etch. In some embodiments, b) further comprises patterning using a photoresist in one or more of steps i), ii), or iii) for etching. In some embodiments, step b) further comprises patterning for etching using a photoresist in step ii). In some embodiments, step iii) is without removal of the photoresist in step ii). In some embodiments, the method further comprises subsequent to step b) and prior to step c), removing the photoresist. In some embodiments, step d) comprises using one or more of: chemical vapor deposition (CVD), plasma enhanced chemical vapor deposition (PECVD), sputter deposition, evaporation, spin-on, or plating materials.

In some embodiments, step d) comprises: i) depositing a RDL dielectric layer over the first piezoelectric device; and ii) depositing a RDL conductor layer over the RDL dielectric layer. In some embodiments, step d) further comprises: subsequent to step i) and prior to step ii), etching and patterning the RDL dielectric layer; subsequent to step ii), etching and patterning the RDL conductor layer, or both. Another embodiment of step d) comprises: subsequent to step i) and prior to step ii), etching and patterning the RDL dielectric layer; step ii) is achieved using a lift-off process to both deposit and pattern the RDL conductor layer. A further embodiment of step d) includes a process by which both steps i) and ii) are performed via lift-off. Yet another embodiment of step d) is such that step i) depositing and patterning the RDL dielectric layer via lift-off; subsequent to step ii), patterning and etching the RDL conducting layer.

In some embodiments, step c) comprises using an isotropic etch or a wet etch to etch through the first piezoelectric layer. In some embodiments, step c) comprises using an anisotropic etch or a dry etch to etch through the first piezoelectric layer. In some embodiments, step c) comprises: i) deposit a photoresist over the first piezoelectric device; ii) etching the first piezoelectric layer to a pre-determined depth; and iii) etching through the first piezoelectric layer from the pre-determined depth to stop at a top surface of the first bottom electrode along a vertical direction and; iv) removing the photoresist from the first piezoelectric device. In some embodiments, step ii) comprises using an isotropic etch or a wet etch and step iii) comprises using an anisotropic etch or a dry etch. In some embodiments, step ii) comprises using an anisotropic etch or a dry etch and step iii) comprises using an isotropic etch or a wet etch. In some embodiments, the first piezoelectric layer comprises a stepped profile along a vertical direction configured to mitigate issues in topography of the vias. In some embodiments, the pre-determined depth is less than a full depth of the piezoelectric layer along a vertical direction.

In some embodiments, the method herein is configured for decreasing a characteristic length of the one or more vias along a horizontal direction thereby increasing packing density of the plurality of piezoelectric devices. In some embodiments, step c) comprises: i) deposit a photoresist over the first piezoelectric device; ii) etching the first piezoelectric layer using isotropic etch; and iii) removing the photoresist. In some embodiments, etching one or more of the first bottom electrode, the first piezoelectric layer, or the first top electrode comprises etching two of the first bottom electrode, the first piezoelectric layer, and the first top electrode. In some embodiments, each of the plurality of piezoelectric devices is independent.

In another aspect, disclosed herein is a method for producing multi-poled piezoelectric devices, the method comprising: a) providing a first piezoelectric device, the first piezoelectric device comprising: a first bottom electrode, a first piezoelectric layer, a first top electrode, and a first substrate; b) etching the first top electrode; c) depositing a RDL dielectric layer over the first top electrode; d) etching the RDL dielectric layer using anisotropic etch; e) etching the first piezoelectric layer using anisotropic etch; and f) depositing a RDL conductor layer over the RDL dielectric layer. In some embodiments, the method further comprises depositing a photoresist subsequent to step c) and prior to step d); and removing the photo resist prior to step f).

In yet another aspect, disclosed herein is a multi-poled piezoelectric device, the device comprising: a) a top electrode, a piezoelectric layer, and a bottom electrode fabricated on a substrate; b) vias generated by etching the piezoelectric layer, the top electrode, or both; and c) a re-distribution layer (RDL) deposited over one or more of: the top electrode, the piezoelectric layer, the bottom electrode, or the one or more vias. In some embodiments, the one or more vias comprises: a pre-determined depth in the piezoelectric layer etched by a first method; a second depth continuing from the pre-determined depth in the piezoelectric layer etched by a second method to stop a top surface of the bottom electrode. In some embodiments, the first method is an isotropic etch or a wet etch and the second method is an anisotropic etch or a dry etch. In some embodiments, the first method is an anisotropic etch or a dry etch and the second method is isotropic etch or a wet etch. In some embodiments, the first piezoelectric layer comprises a stepped profile along a vertical direction configured to mitigate issues in topography of the vias. In some embodiments, the pre-determined depth is less than a full depth of the piezoelectric layer along a vertical direction. In some embodiments, the RDL comprises a RDL dielectric layer and a RDL conductor layer thereabove. In some embodiments, one or both of the RDL dielectric layer and the RDL conductor layer is etched. In some embodiments, one or more of the top electrode, piezoelectric layer, or bottom electrode is generated from etching a first piezoelectric device. In some embodiments, the first piezoelectric device comprises a first bottom electrode, a first piezoelectric layer, a first top electrode, and a first substrate. In some embodiments, the first piezoelectric device is uni-poled. In some embodiments, the first piezoelectric device is multi-poled.

Certain Terms

Unless otherwise defined, all technical terms used herein have the same meaning as commonly understood by one of ordinary skill in the art to which this invention belongs.

As used herein, the singular forms "a," "an," and "the" include plural references unless the context clearly dictates otherwise. Any reference to "or" herein is intended to encompass "and/or" unless otherwise stated.

In some embodiments, the electrode herein is equivalent to a conductor. In some embodiments, the wafer herein includes one or more piezoelectric devices. In some embodiments, the wafer herein includes multiple independent piezoelectric devices formed from a bottom electrode 200, a piezoelectric material 201, and a top electrode 202, 203, all fabricated on a handle substrate 100.

In some embodiments, the piezoelectric thin film is used such that the piezoelectric effect is manifested through the film's d31 coefficient. This means that a strain in the film's lateral direction (the "1" direction) can result in a charge density in the vertical direction (or "3" direction). In this manner, a piezoelectric device can be made with top and bottom electrodes and take advantage of this piezoelectric coefficient. Under a tensile strain, a change in voltage of dV may be developed across the electrodes, while an equal and opposite compressive strain will result in a change in voltage of –dV.

In some embodiments, actuators and/or sensors utilizing bending beams or diaphragms can develop both tensile and compressive strains at the same moment. The piezoelectric material can be placed at these strain points to actuate or sense the strains of the device. In some embodiments, electrode or pole configuration needs to be considered such that an electrode does not develop competing positive and negative voltages.

Referring to FIGS. 1a-1b, in a particular embodiment, the pMUT includes a substrate 100 with a membrane 101 formed, for example, by a substrate etch. FIG. 1a shows the lay-out view of the pMUT at BB' in FIG. 1b, and FIG. 1b shows the cross-section view at AA' in FIG. 1a. In this embodiment, on top of the substrate 100, is a dielectric 102 layer, and a piezoelectric film 201 sandwiched between a bottom conductor 200 and top conductor(s) 202, 203. In this embodiment, the pMUT operates by converting an out-of-plane electric field between the bottom and top conductors (200, 202, and 203) into an in-plane strain which flexes the membrane 101. Thus, the pMUT transduces electrical charge into mechanical motion, e.g., ultrasonic waves.

In some embodiments, the pMUT can be operated in its fundamental mode, i.e., drum mode, as illustrated in FIG. 2a. As noted in FIG. 2b, the top of the membrane 101 along the vertical direction (z direction) can develop a region of tensile strain in the center, and an annular region of compressive strain around the membrane edge. In some embodiments, the film 201 is poled in only one direction as illustrated by the arrows in FIGS. 1a-1b and FIGS. 3a-3b, along the vertical direction. Such a film can be a unipolar film.

Figure 4:
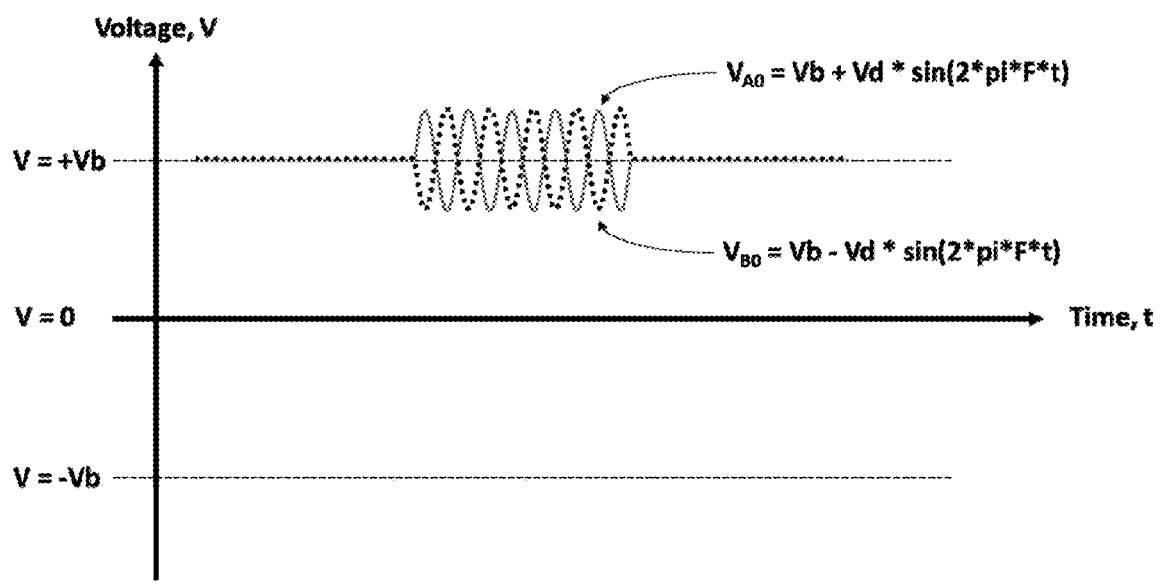

In some embodiments, to effectively drive the drum mode of FIG. 2a and keep the film 201 poled, a non-limiting exemplary drive scheme as illustrated in FIG. 4 can be used. In this embodiment, $V_{A0}$ is the voltage from Port A to Port 0 (e.g., in FIGS. 1a and 3a), and $V_{B0}$ is the voltage from Port B to Port 0, and F is the frequency of the drum mode. $V_{A0}$ and $V_{B0}$ can be of the same magnitude and frequency, but different phase. In some embodiments, $V_{A0}$ and $V_{B0}$ can be out of phase by about half a cycle or 180 degrees. In this embodiment, the positive constants Vb and Vd are the bias voltage and drive voltage respectively, where Vd<Vb. The function sin(2*pi*F*t) is a sine wave of unit amplitude and frequency F. In this case, if $V_{A0}$ develops a compressive stress in the piezoelectric film at the periphery, $V_{B0}$ can develop a tensile stress in the center of the diaphragm, matching the stress pattern of the drum mode illustrated in FIG. 2b. This configuration may require at least three ports, and electronics that can deliver a two-phased drive voltage.

Figure 2:
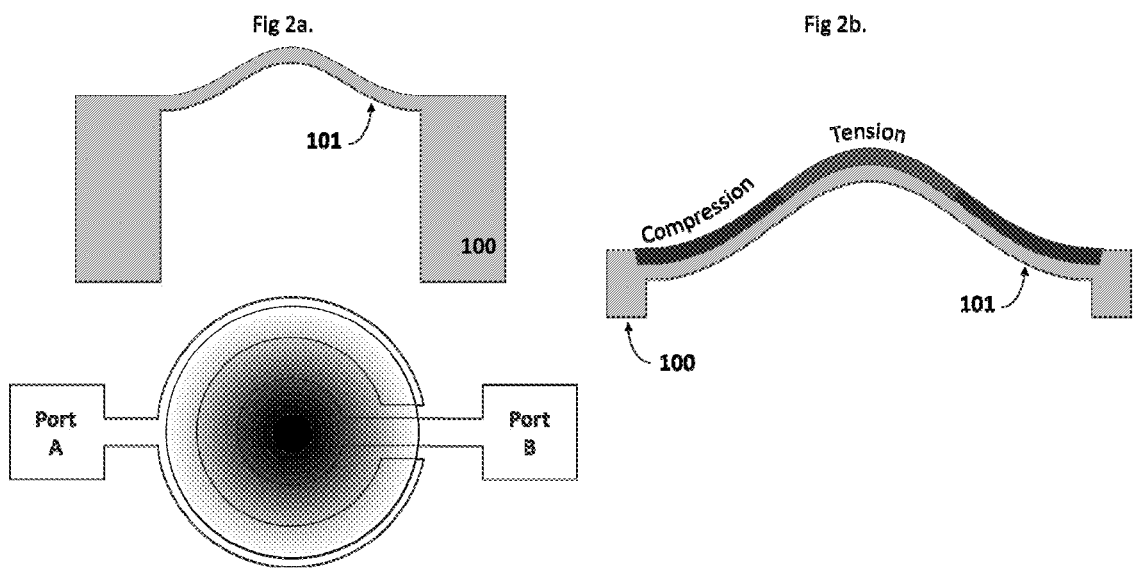
FIG. 2a shows an exemplary primary drum mode of operation of the pMUT in FIGS. 1a-1b, in cross-section (top) and layout (bottom) views (Note: the films on the substrate and diaphragm are not drawn for illustrative purposes, but the electrodes of Ports A and B are overlaid on the layout view. In the layout view, deflection is depicted by grey level, with black as maximum positive deflection, and white as minimum deflection)
FIG. 2b is a close-up of the diaphragm in FIG. 2a in cross-section view, depicting tensile and compressive strains in the substrate.
Figure 3:
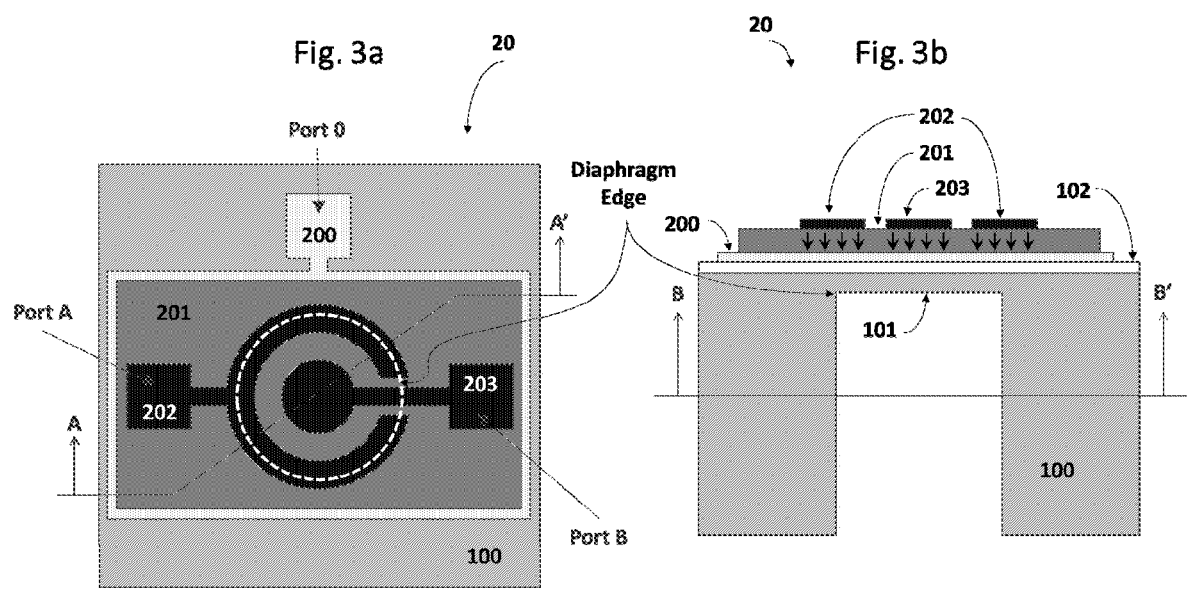
FIGS. 3a and 3b show an exemplary unipolar diaphragm-based pMUT in layout (FIG. 3a) and cross-section (FIG. 3b) views; the pole direction of the piezoelectric material is indicated by the arrows in the cross-section view.

Similarly, when sensing the voltage across the piezoelectric film while vibrating in the drum mode configuration of FIG. 2, the piezoelectric film 201 may develop a positive change in voltage in the tensile region, across Port B and Port 0. At the same time, in the compressive region, the piezoelectric film might develop a negative change in voltage across Port A and Port 0.

Figure 5:
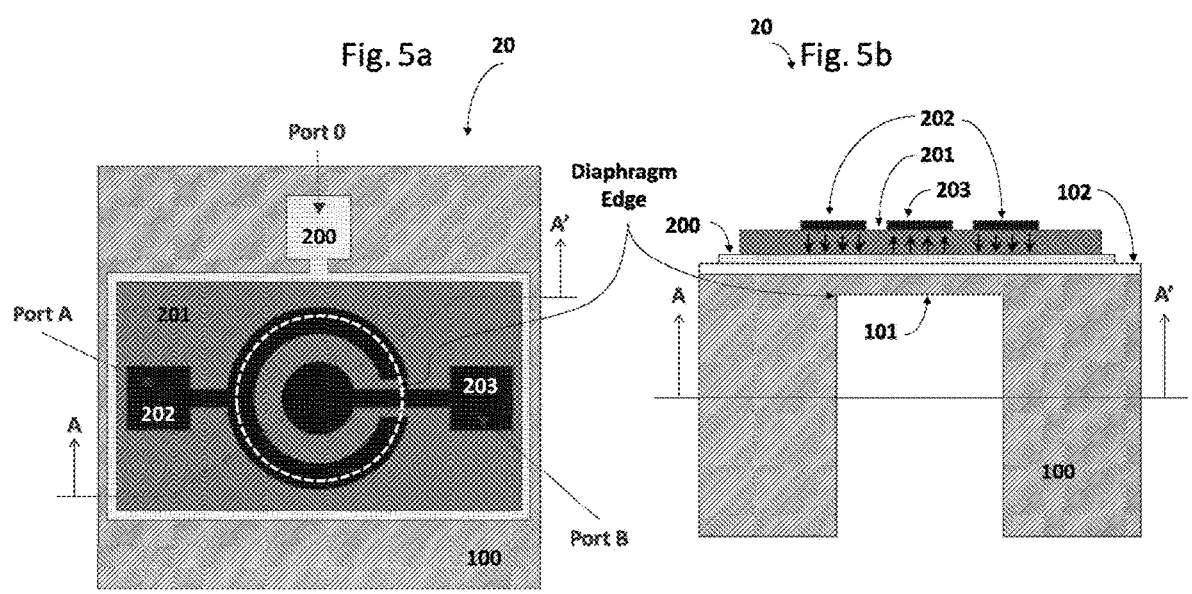
FIGS. 5a and 5b show an exemplary dipolar diaphragm-based pMUT in layout (FIG. 5a) and cross-section (FIG. 5b) views; the pole direction of the piezoelectric material is indicated by the arrows in the cross-section view.
Figure 6:
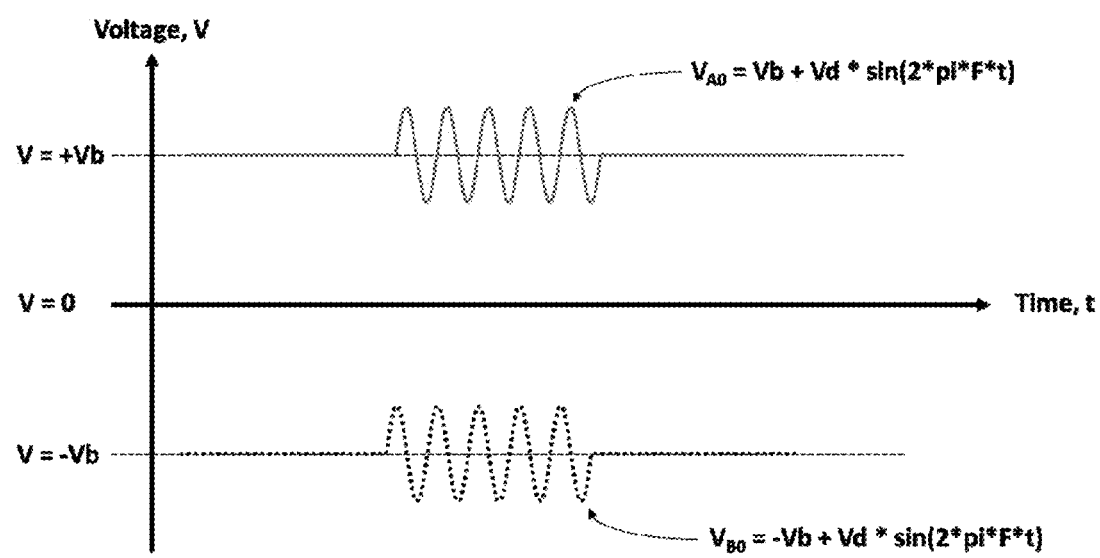

In some embodiments, a different drive and/or sense scheme can be used with a bipolar film. In some embodiments, a bipolar film is a multi-poled film with two polarities, such as the pMUT illustrated in FIG. 5. In this case, to effectively drive the drum mode of FIG. 2a and keep the films poled, an exemplary drive scheme illustrated in FIG. 6 can be used. In this embodiment, the drive scheme can include two bias voltages, Vb and –Vb with only one phase of the sinusoidal drive voltage so that $V_{A0}$ and $V_{B0}$ can have the same phase. This configuration may require at least three ports connecting to the device.

Figure 7A:
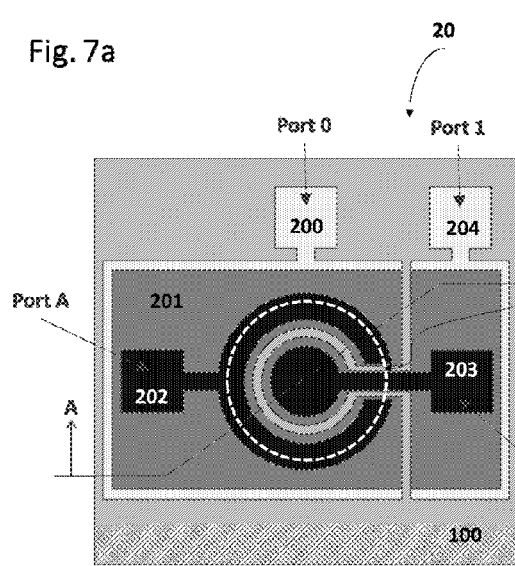
FIGS. 7a and 7b show an exemplary dipolar diaphragm-based pMUT in layout (FIG. 7a) and cross-section (FIG. 7b) views; the pole direction of the piezoelectric material is indicated by the arrows in the cross-section view.
Figure 7B:
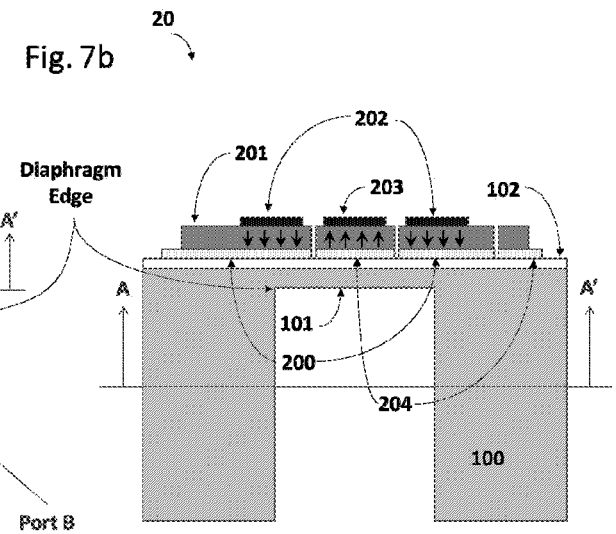
Figure 8:
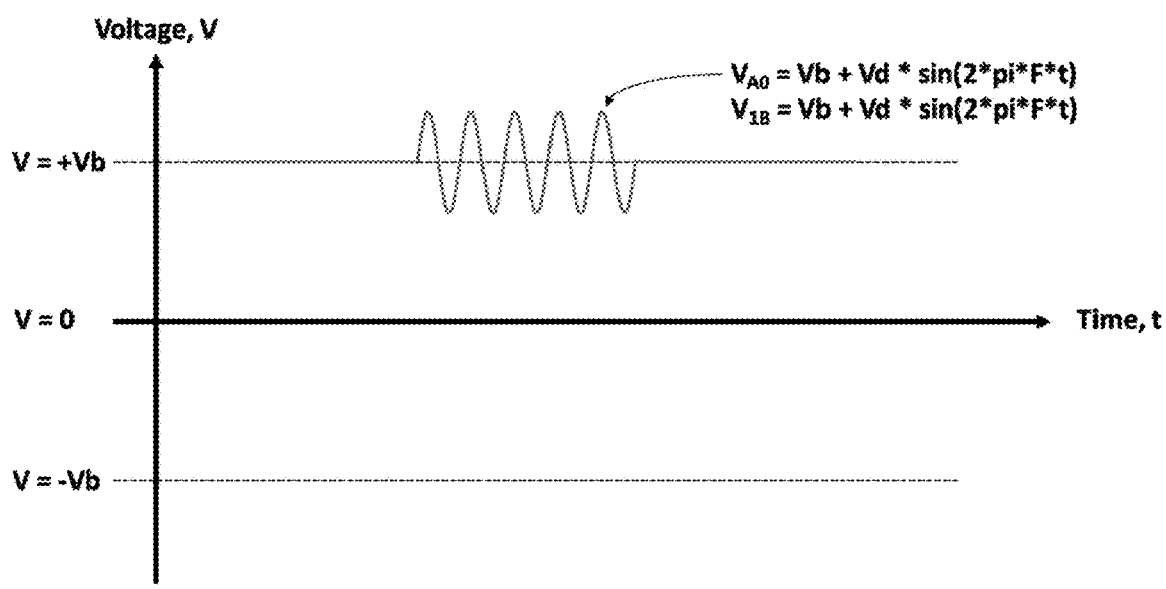

In some embodiments, if there are separate bottom electrodes, as pictured in FIGS. 7a-7b, with a bipolar film 201, the drum mode of FIG. 2a can be driven with the voltages shown in FIG. 8. In this case, only a single bias voltage Vb and a single drive phase are necessary, and the minimum number of ports is reduced from three to two.

In some embodiments, integration with large numbers of pMUTs can have a technical challenge in interconnecting the device to the outside world (e.g., Re-Distribution Layers [RDLs] over topography and dense packing, high count dense wirebond arrays, or array bond techniques such as flip-chip, ball bump, thermocompression bonding, eutectic bonding, etc.). Such technical challenge may exist in applications including ultrasound imaging, inkjet printheads, memory cells, and capacitors. In some embodiments, reducing the complexity of interconnect advantageously reduces the manufacturing challenges, ASIC requirements, and/or increases yields. One method of addressing the challenge in interconnecting the device to another device may be bonding the die on which the device is fabricated to a die on which the other device is fabricated.

In some embodiments, the methods herein are configured for creating high packing density bipolar piezoelectric devices. In some embodiments, the methods herein include but are not limited to one or more operations, not necessarily in the order(s) that are disclosed herein: adding through-film etches to construct multiple bottom electrodes, adding a RDL composed of an additional dielectric and metal layer to enable interconnections between multiple ports, and modifying contact etches to reduce their footprint for higher packing density.

In some embodiments, the methods herein start with an existing thin-film piezoelectric device 20 or any other devices that include a bottom electrode 200, a piezoelectric material 201, and a top electrode 202, 203, all fabricated on a handle substrate 100, as shown in FIGS. 1a-1b, 3a-3b, 5a-5b, and FIGS. 9a, 10a, 11a, 12a, and 13a. In some embodiments, the existing thin-film piezoelectric device 20 may already include a patterned and/or etched top electrode 202, 203 as shown in FIGS. 1a-1b and 3a-3b, a backside cavity as shown in FIG. 1b, and open access to the bottom electrode 200 as shown in FIG. 7b.

In some embodiments, a pMUT process can be carried out on a thin film piezoelectric device 20 which allows one to pattern the top electrode, add a backside cavity, and/or open access to the bottom electrode. In some embodiments, the piezoelectric device herein is a thin film piezoelectric device. In some embodiments, the piezoelectric device is a uni-poled or multi-poled thin film piezoelectric device. In some embodiments, the methods disclosed herein generate one or more high packing density multi-poled piezoelectric devices from an existing piezoelectric device. As a reference, a low packing density contact (e.g., using only wet etches) might have contacts that occupy 50 µm×50 µm to 100 µm×100 µm of area, a density of 1 contact per 2,500 to 10,000 um^2. In some embodiments, the high packing density piezoelectric devices presented herein can reduce the area requirement to an approximate range of 40 µm×40 µm to 5 µm×5 µm, or 1 contact per 1,600 to 25 µm^2. Further improvements can be realized, depending on film thicknesses and process equipment specifications. Thus, in some embodiment, the high packing density piezoelectric devices can improve packing densities by approximately 2× to 400×. In some embodiments, the multi-poled piezoelectric devices can include 2, 3, 4, or even more poling directions that are different from each other. In some embodiments, the multi-poled piezoelectric devices can include 2 poling directions that are substantially parallel to each other.

Referring to FIGS. 9a-9h, 10a-10g, 11a-11g, 12a-12h, 13a-13h, and 14a-14d, in order to realize high packing density multi-poled (e.g., bipolar) piezoelectric devices, one or more operations can be used on a thin-film piezoelectric device 20, alone or in combination with the pMUT process disclosed herein. In some embodiments, such operations include but are not limited to: through-film etching that etches the top electrode, the piezoelectric layer 201, the bottom electrode 200, or their combinations; depositing an RDL (Re-Distribution Layer) 205, 206; and reducing via 207 dimensions to the bottom electrode by combining an anisotropic dry etch with an isotropic wet etch. In some embodiments, the through-film etching enables the creation of multiple independent piezoelectric devices that can function independently with independent top and bottom electrodes. In some embodiments, the through-film etching enables poling in two directions thereby allowing performance increases in the multiple piezoelectric devices. In some embodiments, the RDL includes an additional dielectric layer 205 and an additional metal layer 206. Both layers of the RDL can be photo-definable. In some embodiments, the RDL or its component(s) allows the designer to greatly reduce the interconnect complexity in the piezoelectric devices and allows creation of higher packing density piezoelectric devices.

FIGS. 9a-9h show an exemplary embodiment for adding the through-film etch and depositing the RDL to an existing piezoelectric device 20. In some embodiments, the existing piezoelectric device is a uni-poled device which can be separated into one or more independent piezoelectric devices, e.g., multi-poled piezoelectric devices. FIG. 9a illustrates the existing piezoelectric device 20 which includes a substrate 100 and a dielectric 102. On top of the dielectric 102 is a piezoelectric film 201 sandwiched between a bottom conductor 200 and top conductor 202. If the top conductor 202 has not been patterned and etched into multiple independent top electrodes, as shown in FIG. 9a, an additional operation for etching and patterning the top electrode 202 can be included. Subsequently, the piezoelectric film 201 is patterned and etched, as shown in FIG. 9b, in some cases, with a photoresist deposited on the device 20. In some embodiments, this is done with an isotropic etch such as a wet etch, as illustrated by the curved profile in FIG. 9b. However, to increase packing density, this etch can be done by an anisotropic technique such as a dry etch. Next, with the photoresist 210 from the previous step still intact or without, the bottom conductor 200 is etched, e.g., with an anisotropic etch, as in FIG. 9c (cross-section shown here after the photoresist 210 is stripped from the device 20). A wet etch can be used as well. The photoresist 210 from the piezoelectric film 201 etch can be removed after the piezoelectric film 201 etch, and a different photoresist film (not shown) deposited and patterned to allow the bottom electrode to be etched.

After the photoresist 210 used to pattern the piezoelectric film 201 and bottom conductor 200 is removed. Contacts 207 such as vias are patterned and etched in the piezoelectric film 201, as illustrated in FIG. 9d. FIGS. 10-13 show exemplary embodiments of etching the contacts 207. Next, as shown in FIG. 9e, a dielectric film, the RDL dielectric 205, is deposited on the device 20 or the wafer. One or multiple techniques can be used for this deposition, including but not limited to CVD (chemical vapor deposition), PECVD (plasma enhanced chemical vapor deposition), sputter deposition, and spin-on materials. Afterwards, contact holes 208 are patterned and etched in the RDL dielectric 205 in FIG. 9f. This can be accomplished with an anisotropic etch or an isotropic etch. Subsequently, an RDL conductor 206 is deposited in FIG. 9g. One or multiple techniques for this deposition can be used, including but not limited to CVD, PECVD, sputter deposition, evaporation, plating and spin-on materials. Finally, the RDL conductor 206 is patterned and etched. This can be accomplished through techniques such as: lift-off, deposition and etch (isotropic or anisotropic), and plating. Contact holes 209 are patterned and etched in the RDL conductor 206 in FIG. 9h. The sequence of operations illustrated in FIGS. 9a-9h may allow the designer to create independent bottom electrodes for multi-poled piezoelectric devices. The RDL layers, RDL dielectric 205 and RDL conductor 206, may allow the designer to densely connect the various top electrodes, e.g., etched from a single top electrode, to the bottom electrode(s), in any number of combinations, allowing for high-density packing and, if designed properly, fewer interconnects to the outside of the device.

To further increase the packing density of the piezoelectric devices, one may also try to shrink the dimensions of the vias from the RDL conductor 206 to the bottom conductor 200. Such an exemplary process is illustrated in FIGS. 10a-10g. In this embodiment, the RDL dielectric 205 is deposited just after the top conductor 202 is patterned and etched, as shown in FIGS. 10a-10b. Next, photoresist 210 is deposited and patterned in FIG. 10c, then the RDL dielectric 205 is etched anisotropically as in FIG. 10d, followed by anisotropically etching the piezoelectric film 201 and stopping on the bottom conductor 200 as shown in FIGS. 10d-10e. The photoresist 210 is removed as in FIG. 10f, and the RDL conductor 206 is deposited as in FIG. 10g. The operations as in FIGS. 10a-10g can result in a small vertical profile good for packing density. However, it may require the RDL conductor 206 to be deposited over significant topography that can sometimes result in voids, broken lines, or other issues.

In some embodiments, to improve topography of the vias, the vias can be generated using isotropic etching of the piezoelectric film 201 as detailed in FIGS. 11a-11g. Referring to FIG. 11a, the top electrode 202 is patterned and etched. Afterwards, photoresist 210 is deposited and patterned as in FIG. 11b. Next the piezoelectric film 201 can be isotopically etched as shown in FIG. 11c. After the photoresist 210 is removed as shown in FIG. 11d, a gently sloping profile in the piezoelectric film 201 remains, reducing the sidewall slope of the via, and minimizing the impact of topography on subsequently deposited layers or films (topography is the difference in the height of the shallowest device feature and the highest device feature). Next, the RDL dielectric 205 is deposited as shown in FIG. 11e and patterned and etched as in FIG. 11f. Finally, the RDL conductor 206 is deposited as shown in FIG. 11g. The process technique illustrated in FIG. 11a-11b can be effective in reducing the sidewall slope of the via, but can result in a larger via than that embodiment in FIGS. 10a-10g.

In some embodiments, the methods herein include a hybrid via processing approach utilizing both an isotropic and anisotropic etch of the piezoelectric film 201. FIGS. 12a-12g show an exemplary embodiment of this hybrid via processing approach. In some embodiments, this hybrid approach advantageously decreases the overall via area, thus increasing packing density. In some embodiments, this hybrid approach advantageously helps mitigate the issue of topography by reducing the via sidewall angle. Referring to FIGS. 12a-12g, in this particular embodiment, the top electrode 202 can be patterned and etched as in FIG. 12a, photoresist 210 can be deposited and patterned on the wafer, as shown in FIG. 12b. The piezoelectric film 201 is then subjected to a partial isotropic etch of the film as illustrated in FIG. 12c. In some embodiments, the partial etch is from a top surface of the film to a pre-determined depth of the film that is smaller than the full thickness of the film (i.e., thickness from top to bottom surface of the film along the vertical direction, or z direction). The depth of the etch can be tuned for depth control and topography mitigation. To complete the etch, an anisotropic etch is performed in FIG. 12d, going from the predetermined depth and through the piezoelectric film 201 and stopping at the top surface of the bottom conductor 200. After the photoresist 210 is removed in FIG. 12e, the piezoelectric film 201 has a stepped profile as shown in FIG. 12e that tends to mitigate the issues encountered with topography. Next, the RDL dielectric 205 can be deposited in FIG. 12f and patterned and etched, as in FIGS. 12g. Afterwards, the RDL conductor 206 can be deposited as shown in FIG. 12h.

An alternative approach to the technique used in FIG. 12a-12h is to perform the anisotropic etch first, followed by the isotropic etch, as detailed in FIGS. 13a-13h. In this particular embodiment, photoresist 210 is deposited and patterned on the wafer, as shown in FIG. 13b. The piezoelectric film 201 can be subjected to a partial anisotropic etch of the film as illustrated in FIG. 13c. The depth of the etch can be tuned for control and topography mitigation. To complete the etch, an isotropic etch is performed as in FIG. 13d, going through the piezoelectric film 201 and stopping on the bottom conductor 200. After the photoresist 210 is removed, the RDL dielectric 205 is deposited (FIG. 13f) and patterned and etched (FIG. 13g). The RDL conductor 206 can then be deposited (FIG. 13h). In this embodiment, the piezoelectric film 201 has a more sloped profile than that of FIGS. 10a-10g. In the same embodiment, the vias are smaller than that in FIG. 11g and/or FIG. 12h. However, it can still suffer from higher sidewall angles, and the associated topography issues, than FIGS. 11g and 12h.

FIGS. 14a-14d show comparison of the various techniques disclosed herein for forming the RDL conductor 206 to bottom conductor 200 vias. In some embodiments, the characteristic lengths for the vias can be determined as La for the anisotropic etch of FIG. 10g, Lb for the isotropic etch of FIG. 11g, Lc for the isotropic followed by anisotropic etch of FIG. 12h, and Ld for the anisotropic followed by isotropic etch of FIG. 13h. In this embodiment, La<Ld~Lc<Lb. That is, the fully anisotropic etch produces the smallest via, while the fully isotropic etch produces the largest via. The hybrid approaches of isotropic and anisotropic disclosed herein provide a smaller via while reducing concerns regarding topography, enabling denser packing of piezoelectric devices.

In some embodiments, one or more operations in FIGS. 9a-9h, 10a-10g, 11a-11g, 12a-12h, and 13a-13h can be carried out in different orders.

Although certain embodiments and examples are provided in the foregoing description, the inventive subject matter extends beyond the specifically disclosed embodiments to other alternative embodiments and/or uses, and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components.

For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

As used herein A and/or B encompasses one or more of A or B, and combinations thereof such as A and B. It will be understood that although the terms "first," "second," "third" etc. may be used herein to describe various elements, components, regions and/or sections, these elements, components, regions and/or sections should not be limited by these terms. These terms are merely used to distinguish one element, component, region or section from another element, component, region or section. Thus, a first element, component, region or section discussed below could be termed a second element, component, region or section without departing from the teachings of the present disclosure.

The terminology used herein is for the purpose of describing particular embodiments only and is not intended to limit the present disclosure. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

As used in this specification and the claims, unless otherwise stated, the term "about," and "approximately," or "substantially" refers to variations of less than or equal to +/−0.1%, +/−1%, +/−2%, +/−3%, +/−4%, +/−5%, +/−6%, +/−7%, +/−8%, +/−9%, +/−10%, +/−11%, +/−12%, +/−14%, +/−15%, or +/−20%, including increments therein, of the numerical value depending on the embodiment. As a non-limiting example, about 100 meters represents a range of 95 meters to 105 meters (which is +/−5% of 100 meters), 90 meters to 110 meters (which is +/−10% of 100 meters), or 85 meters to 115 meters (which is +/−15% of 100 meters) depending on the embodiments.

While preferred embodiments have been shown and described herein, it will be obvious to those skilled in the art that such embodiments are provided by way of example only. Numerous variations, changes, and substitutions will now occur to those skilled in the art without departing from the scope of the disclosure. It should be understood that various alternatives to the embodiments described herein may be employed in practice. Numerous different combinations of embodiments described herein are possible, and such combinations are considered part of the present disclosure. In addition, all features discussed in connection with any one embodiment herein can be readily adapted for use in other embodiments herein. It is intended that the following claims define the scope of the disclosure and that methods and structures within the scope of these claims and their equivalents be covered thereby.

The invention claimed is:

1. A multi-poled piezoelectric device, the multi-poled piezoelectric device comprising:
   a) a top electrode, a piezoelectric layer, and a bottom electrode fabricated on a substrate;
   b) a first vertical interconnect access (via) generated by etching the piezoelectric layer and the top electrode;
   c) a second vertical interconnect access (via) generated by etching the piezoelectric layer, the top electrode, and the bottom electrode; and
   d) a re-distribution layer (RDL) deposited over one or more of: the top electrode, the piezoelectric layer, the bottom electrode, or the one or more vias.

2. The multi-poled piezoelectric device of claim 1, wherein the one or more vias comprises: a pre-determined depth in the piezoelectric layer etched by a first method; a second depth continuing from the pre-determined depth in the piezoelectric layer etched by a second method to stop at a top surface of the bottom electrode.

3. The multi-poled piezoelectric device of claim 1, wherein the piezoelectric layer comprises a stepped profile along a vertical direction configured to mitigate issues in topography of the one or more vias.

4. The multi-poled piezoelectric device of claim 2, wherein the pre-determined depth is less than a full depth of the piezoelectric layer along a vertical direction.

5. The multi-poled piezoelectric device of claim 1, wherein the RDL comprises a RDL dielectric layer and a RDL conductor layer thereabove.

6. The multi-poled piezoelectric device of claim 1, wherein one or more of the top electrode, the piezoelectric layer, or the bottom electrode is generated from etching a first piezoelectric device.

7. The multi-poled piezoelectric device of claim 2, wherein the first method is an isotropic etch or a wet etch and the second method is an anisotropic etch or a dry etch.

8. The multi-poled piezoelectric device of claim 2, wherein the first method is an anisotropic etch or a dry etch and the second method is an isotropic etch or a wet etch.

9. The multi-poled piezoelectric device of claim 5, wherein the RDL dielectric layer is patterned and etched using a lift-off process and the RDL conductor layer is deposited and patterned using a lift-off process.

10. The multi-poled piezoelectric device of claim 5, wherein one or both of the RDL dielectric layer and the RDL conductor layer is etched.

11. The multi-poled piezoelectric device of claim 6, wherein the first piezoelectric device comprises a first bottom electrode, a first piezoelectric layer, a first top electrode, and a first substrate.

12. The multi-poled piezoelectric device of claim 6, wherein the first piezoelectric device is uni-poled.

13. The multi-poled piezoelectric device of claim 6, wherein the first piezoelectric device is multi-poled.

14. The multi-poled piezoelectric device of claim 6, wherein the multi-poled piezoelectric device or the first piezoelectric device is at least part of a piezoelectric micromachined ultrasonic transducer (pMUT).

15. A multi-poled piezoelectric device, the multi-poled piezoelectric device comprising:
   a first piezoelectric device comprising:
      a first bottom electrode;
      a first piezoelectric layer;
      a first top electrode; and
      a first substrate;

one or more of the first bottom electrode, the first piezoelectric layer, or the first top electrode being etched to separate the first piezoelectric device into a plurality of piezoelectric devices;

one or more first vertical interconnect access (vias) created from etching the first piezoelectric layer and the first top electrode;

one or more second vertical interconnect access (vias) created from etching the piezoelectric layer, the top electrode, and the bottom electrode; and a re-distribution layer (RDL) over the first piezoelectric device, the one or more vias, or both.

16. The multi-poled piezoelectric device of claim 15, wherein the first top electrode is etched to create a plurality of top electrodes.

17. The multi-poled piezoelectric device of claim 16, wherein the first piezoelectric layer is etched to generate a plurality of piezoelectric layers.

18. The multi-poled piezoelectric device of claim 17, wherein the first bottom electrode is etched to generate a plurality of bottom electrodes.

19. The multi-poled piezoelectric device of claim 15, wherein the RDL comprises a RDL dielectric layer deposited over the first piezoelectric device and a RDL conductor layer deposited over the RDL dielectric layer.

\* \* \* \* \*